(12) United States Patent
Lee et al.

(10) Patent No.: US 8,623,704 B2
(45) Date of Patent: Jan. 7, 2014

(54) ADHESIVE/SPACER ISLAND STRUCTURE FOR MULTIPLE DIE PACKAGE

(75) Inventors: Sang Ho Lee, Yeoju (KR); Jong Wook Ju, Kyoungnam (KR); Hyeog Chan Kwon, Seoul (KR)

(73) Assignee: CHIPPAC, Inc., Fremont, CA (US)

( * ) Notice: Subject to any disclaimer, the term of this patent is extended or adjusted under 35 U.S.C. 154(b) by 818 days.

(21) Appl. No.: 11/530,841

(22) Filed: Sep. 11, 2006

(65) Prior Publication Data

US 2007/0015314 A1 Jan. 18, 2007

Related U.S. Application Data

(62) Division of application No. 10/969,116, filed on Oct. 20, 2004, now abandoned.

(60) Provisional application No. 60/573,903, filed on May 24, 2004, provisional application No. 60/573,956, filed on May 24, 2004.

(51) Int. Cl.
*H01L 21/44* (2006.01)
*H01L 21/48* (2006.01)

(52) U.S. Cl.
USPC ........... 438/118; 438/109; 438/127; 438/617; 257/E21.505; 257/E23.169

(58) Field of Classification Search
USPC .......... 438/109, 118, 127, 617; 257/E21.505, 257/E23.169
See application file for complete search history.

(56) References Cited

U.S. PATENT DOCUMENTS

| 5,140,404 A | 8/1992 | Fogal et al. |
| 5,218,229 A | 6/1993 | Farnworth |

(Continued)

FOREIGN PATENT DOCUMENTS

| JP | 05152505 A | 6/1993 |
| JP | 2001223326 A | 8/2001 |
| KR | 2001068614 A | 7/2001 |
| KR | 2004085348 A | 10/2004 |

OTHER PUBLICATIONS

Lintec Semiconductor-Related Products Web Site, "Adwill Semiconductor-Related Products", 1 page, http://www.lintec.co.jp/e-dept/english/adwill/adwill.html, downloaded Mar. 1, 2004.
Lintec Semiconductor-Related Products Web Site, "Products for Dicing Process", 2 pages, http://www.lintec.co.jp/e-dept/english/adwill/diceproces.html, downloaded Mar. 1, 2004.
Lintec Semiconductor-Related Products Web Site, "Products for back-grinding process", 1 page, http://www.lintec.co.jp/e-dept/english/adwill/bgproces.html, Downloaded Mar. 1, 2004.

*Primary Examiner* — Nitin Parekh
(74) *Attorney, Agent, or Firm* — Ishimaru & Associates LLP

(57) ABSTRACT

An adhesive/spacer structure (52, 52A, 60) is used to adhere first and second die (14, 18) to one another at a chosen separation in a multiple-die semiconductor chip package (56). The first and second die define a die bonding region (38) therebetween. The adhesive/spacer structure may comprise a plurality of spaced-apart adhesive/spacer islands (52, 52A) securing the first and second die to one another at a chosen separation (53). The adhesive/spacer structure may also secure the first and second die to one another to occupy about 1-50% of the die bonding region.

14 Claims, 4 Drawing Sheets

(56) References Cited

U.S. PATENT DOCUMENTS

| | | |
|---|---|---|
| 5,222,014 A | 6/1993 | Lin |
| 5,229,960 A | 7/1993 | De Givry |
| 5,323,060 A | 6/1994 | Fogal et al. |
| 5,340,771 A | 8/1994 | Rostoker |
| 5,372,883 A | 12/1994 | Shores |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,652,185 A | 7/1997 | Lee |
| 5,744,863 A | 4/1998 | Culnane et al. |
| 5,753,358 A * | 5/1998 | Korleski .................... 428/308.4 |
| 5,776,799 A | 7/1998 | Song et al. |
| 5,898,219 A | 4/1999 | Barrow |
| 5,899,705 A | 5/1999 | Akram |
| 5,903,049 A | 5/1999 | Mori |
| 5,945,733 A | 8/1999 | Corbett et al. |
| 5,977,640 A | 11/1999 | Bertin et al. |
| 5,982,633 A | 11/1999 | Jeansonne |
| 5,994,166 A | 11/1999 | Akram et al. |
| 6,025,648 A | 2/2000 | Takahashi et al. |
| 6,034,875 A | 3/2000 | Heim et al. |
| 6,075,289 A | 6/2000 | Distefano |
| 6,118,176 A | 9/2000 | Tao et al. |
| 6,133,626 A | 10/2000 | Hawke et al. |
| 6,157,080 A | 12/2000 | Tamaki et al. |
| 6,177,729 B1 | 1/2001 | Benenati et al. |
| 6,201,266 B1 | 3/2001 | Ohuchi et al. |
| 6,201,302 B1 | 3/2001 | Tzu |
| 6,238,946 B1 | 5/2001 | Ziegler |
| 6,238,949 B1 | 5/2001 | Nguyen et al. |
| 6,265,763 B1 | 7/2001 | Jao et al. |
| 6,265,766 B1 | 7/2001 | Moden |
| 6,274,930 B1 | 8/2001 | Vaiyapuri et al. |
| 6,316,838 B1 | 11/2001 | Ozawa et al. |
| 6,333,552 B1 | 12/2001 | Kakimoto et al. |
| 6,333,562 B1 | 12/2001 | Lin |
| 6,340,846 B1 | 1/2002 | LoBianco et al. |
| 6,351,028 B1 | 2/2002 | Akram |
| 6,376,904 B1 | 4/2002 | Haba et al. |
| 6,388,313 B1 | 5/2002 | Lee et al. |
| 6,400,007 B1 | 6/2002 | Wu et al. |
| 6,407,456 B1 | 6/2002 | Ball |
| 6,413,798 B2 | 7/2002 | Asada |
| 6,414,381 B1 | 7/2002 | Takeda |
| 6,424,050 B1 | 7/2002 | Komiyama |
| 6,436,732 B2 | 8/2002 | Ahmad |
| 6,441,496 B1 | 8/2002 | Chen et al. .................... 257/777 |
| 6,445,064 B1 | 9/2002 | Ishii et al. |
| 6,462,421 B1 | 10/2002 | Hsu et al. |
| 6,472,732 B1 | 10/2002 | Terui |
| 6,472,741 B1 | 10/2002 | Chen et al. |
| 6,472,758 B1 | 10/2002 | Glenn et al. |
| 6,489,676 B2 | 12/2002 | Taniguchi et al. |
| 6,492,726 B1 | 12/2002 | Quek et al. |
| 6,501,165 B1 | 12/2002 | Farnworth et al. |
| 6,503,821 B2 | 1/2003 | Farquhar et al. |
| 6,512,303 B2 | 1/2003 | Moden |
| 6,538,319 B2 | 3/2003 | Terui |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,569,709 B2 | 5/2003 | Derderian ............... 438/109 |
| 6,570,249 B1 | 5/2003 | Liao et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,611,063 B1 | 8/2003 | Ichinose et al. |
| 6,620,651 B2 | 9/2003 | He et al. |
| 6,621,169 B2 | 9/2003 | Kikuma et al. |
| 6,621,172 B2 | 9/2003 | Nakayama et al. |
| 6,649,448 B2 | 11/2003 | Tomihara |
| 6,650,009 B2 | 11/2003 | Her et al. |
| 6,650,019 B2 | 11/2003 | Glenn et al. |
| 6,660,560 B2 | 12/2003 | Chaudhuri et al. |
| 6,667,556 B2 | 12/2003 | Moden |
| 6,690,089 B2 | 2/2004 | Uchida |
| 6,700,178 B2 | 3/2004 | Chen et al. |
| 6,706,557 B2 | 3/2004 | Koopmans |
| 6,710,455 B2 | 3/2004 | Goller et al. |
| 6,716,676 B2 | 4/2004 | Chen et al. |
| 6,734,539 B2 | 5/2004 | Degani et al. |
| 6,734,552 B2 | 5/2004 | Combs et al. |
| 6,737,750 B1 | 5/2004 | Hoffman et al. |
| 6,746,894 B2 | 6/2004 | Fee et al. |
| 6,747,361 B2 | 6/2004 | Ichinose |
| 6,753,613 B2 * | 6/2004 | Levardo et al. ............... 257/780 |
| 6,762,488 B2 | 7/2004 | Maeda et al. |
| 6,777,799 B2 | 8/2004 | Kikuma et al. |
| 6,777,819 B2 | 8/2004 | Huang |
| 6,784,555 B2 | 8/2004 | Watson |
| 6,787,915 B2 | 9/2004 | Uchida et al. |
| 6,787,916 B2 | 9/2004 | Halahan |
| 6,794,749 B2 | 9/2004 | Akram |
| 6,818,980 B1 | 11/2004 | Pedron, Jr. |
| 6,828,665 B2 | 12/2004 | Pu et al. |
| 6,833,287 B1 | 12/2004 | Hur et al. |
| 6,835,598 B2 | 12/2004 | Baek et al. |
| 6,838,761 B2 | 1/2005 | Karnezos |
| 6,847,105 B2 | 1/2005 | Koopmans |
| 6,858,468 B2 | 2/2005 | Nguyen et al. |
| 6,864,566 B2 | 3/2005 | Choi |
| 6,882,057 B2 | 4/2005 | Hsu |
| 6,885,093 B2 | 4/2005 | Lo et al. |
| 6,890,798 B2 | 5/2005 | McMahon |
| 6,900,528 B2 | 5/2005 | Mess et al. |
| 6,906,415 B2 | 6/2005 | Jiang et al. |
| 6,906,416 B2 | 6/2005 | Karnezos |
| 6,919,627 B2 | 7/2005 | Liu et al. |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,101,731 B2 | 9/2006 | Karnezos |
| 7,247,942 B2 | 7/2007 | Nguyen et al. |
| 2001/0048151 A1 * | 12/2001 | Chun ..................... 257/686 |
| 2002/0096755 A1 | 7/2002 | Fukui et al. |
| 2002/0130404 A1 | 9/2002 | Ushijima et al. |
| 2003/0001252 A1 * | 1/2003 | Ku et al. ................ 257/686 |
| 2003/0038357 A1 | 2/2003 | Derderian |
| 2003/0038374 A1 | 2/2003 | Shim et al. |
| 2003/0054162 A1 | 3/2003 | Watson |
| 2003/0113952 A1 | 6/2003 | Sambasivam et al. |
| 2003/0141582 A1 | 7/2003 | Yang et al. |
| 2003/0153134 A1 | 8/2003 | Kawata et al. |
| 2003/0178710 A1 | 9/2003 | Kang et al. |
| 2004/0016939 A1 | 1/2004 | Akiba et al. |
| 2004/0026768 A1 | 2/2004 | Taar et al. |
| 2004/0039127 A1 | 2/2004 | Amou et al. ............... 525/328.9 |
| 2004/0061213 A1 | 4/2004 | Karnezos |
| 2004/0195667 A1 | 10/2004 | Karnezos |
| 2004/0212096 A1 | 10/2004 | Wang |
| 2005/0090050 A1 | 4/2005 | Shim et al. |
| 2005/0106779 A1 | 5/2005 | Bolken et al. |
| 2005/0224959 A1 | 10/2005 | Kwon et al. |
| 2005/0243268 A1 | 11/2005 | Nisato et al. ................ 349/201 |

(56) References Cited

U.S. PATENT DOCUMENTS

| | | |
|---|---|---|
| 2006/0043556 A1 | 3/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |

* cited by examiner

ADHESIVE/SPACER ISLAND STRUCTURE FOR MULTIPLE DIE PACKAGE

CROSS-REFERENCE TO RELATED APPLICATIONS

This application is a Divisional of U.S. application Ser. No 10/969,116, filed Oct. 20, 2004, which claims priority from U.S. Provisional Application No. 60/573,903, filed May 24, 2004, titled "Adhesive/spacer island structure for multiple die package"; and which also claims priority from related U.S. Provisional Application No. 60/573,956, filed May 24, 2004, titled "Multiple die package with adhesive/spacer structure and insulated die surface". This application is related to U.S. application Ser. No. 10/969,303, filed Oct. 20, 2004.

BACKGROUND

To obtain the maximum function and efficiency from the minimum package, various types of increased density packages have been developed. Among these various types of packages is the multiple-die semiconductor chip package, commonly referred to as a multi-chip module, multi-chip package or stacked chip package. A multi-chip package includes one or more integrated circuit semiconductor chips, often referred to as circuit die, stacked one onto another to provide the advantages of light weight, high density, and enhanced electrical performance. To stack the semiconductor chips, each chip can be lifted by a chip-bonding tool, which is usually mounted at the end of a pick-and-place device, and mounted onto the substrate or onto a semiconductor chip mounted previously.

In some circumstances, such as when the upper die is smaller than the lower die, the upper die can be attached directly to the lower die without the use of spacers. However, when spacers are needed between the upper and lower die, spacer die, that is die without circuitry, can be used between the upper and lower die. In addition, adhesives containing spacer elements, typically micro spheres, are often used to properly separate the upper and lower die. See U.S. Pat. Nos. 5,323,060; 6,333,562; 6,340,846; 6,388,313; 6,472,758; 6,569,709; 6,593,662; 6,441,496; and U.S. patent publication number US 2003/0178710.

After the chip mounting process, bonding pads of the chips are connected to bonding pads of the substrate with Au or Al wires during a wire bonding process to create an array of semiconductor chip devices. Finally, the semiconductor chips and their associated wires connected to the substrate are encapsulated, typically using an epoxy-molding compound, to create an array of encapsulated semiconductor devices. The molding compound protects the semiconductor devices from the external environment, such as physical shock and humidity. After encapsulation, the encapsulated devices are separated, typically by sawing, into individual semiconductor chip packages.

SUMMARY

A first aspect of the invention is directed to an adhesive/spacer structure used to adhere first and second die to one another at a chosen separation in a multiple-die semiconductor chip package. The adhesive/spacer structure comprises a plurality of spaced-apart adhesive/spacer islands securing the first and second die to one another at a chosen separation.

A second aspect of the invention is directed to multiple-die semiconductor chip package. A first die is mounted to the substrate, the first die having a first surface bounded by a periphery and having bond pads at the first surface. Wires are bonded to and extend from the bond pads outwardly past the periphery to the substrate. A second surface of a second die is positioned opposite the first surface to define a die bonding region therebetween. A plurality of spaced-apart adhesive/spacer islands are within the die bonding region and secure the first and second die to one another at a chosen separation to create a multiple-die subassembly. The adhesive/spacer islands comprise spacer elements within an adhesive. A material encapsulates the multiple-die subassembly to create a multiple-die semiconductor chip package.

A third aspect of the invention is directed to adhesive/spacer structure used to adhere opposed surfaces of first and second die to one another at a chosen separation in a multiple-die semiconductor chip package. The first and second die define a die bonding region therebetween. The adhesive/spacer structure comprises spacer elements within an adhesive. The adhesive/spacer structure secures the first and second die to one another and occupies at most about 50% of the die bonding region.

A fourth aspect of the invention is directed to a multiple-die semiconductor chip package. A first die is mounted to a substrate, the first die having a first surface bounded by a periphery and having bond pads at the first surface. Wires are bonded to and extend from the bond pads outwardly past the periphery to the substrate. A second surface of a second die is positioned opposite the first surface to define a die bonding region therebetween. An adhesive/spacer structure within the die bonding region secures the first and second surfaces to one another at a chosen separation to create a multiple-die subassembly. The adhesive/spacer structure comprises spacer elements within an adhesive. The adhesive/spacer structure and occupies at most about 50% of the die bonding region. A material encapsulates the multiple-die subassembly to create a multiple-die semiconductor chip package.

A fifth aspect of the invention is directed to a method for adhering first and second die to one another at a chosen separation in a multiple-die semiconductor chip package. An adhesive/spacer material having spacer elements within an adhesive is selected. The adhesive/spacer material is deposited onto a first surface of a first die at a plurality of spaced-apart positions. A second surface of a second die is located opposite the first surface of the first die and in contact with the adhesive/spacer material therebetween thereby securing the first and second die to one another at a chosen separation. The selecting and depositing steps are carried out to create a plurality of spaced-apart adhesive/spacer islands following the securing step.

A sixth aspect of the invention is directed to a method for creating a multiple-die semiconductor chip package. A first die is mounted to a substrate, the first die having a first surface with bond pads at the first surface. The bond pads are connected to the substrate with wires. An adhesive/spacer material, comprising spacer elements within an adhesive, is selected. The adhesive/spacer material is deposited onto the first surface of the first die at a plurality of spaced-apart positions. A second surface of a second die is located opposite the first surface of the first die and in contact with the adhesive/spacer material therebetween thereby: defining a die bonding region between the first and second surfaces, and securing the first and second die to one another at a chosen separation to create a multiple-die subassembly. The selecting and depositing steps are carried out to create a plurality of spaced-apart adhesive/spacer islands following the securing step. The multiple-die subassembly is encapsulated to create a multiple-die semiconductor chip package.

A seventh aspect of the invention is directed to a method for adhering opposed surfaces of first and second die to one another at a chosen separation in a multiple-die semiconductor chip package. An adhesive/spacer material, having spacer elements within an adhesive, is selected. An amount of the adhesive/spacer material is chosen. The chosen amount the adhesive/spacer material is deposited onto a first surface of a first die. A second surface of a second die is located opposite at the first surface of the first die and in contact with the adhesive/spacer material therebetween thereby: defining a die bonding region between the first and second surfaces, and securing the first and second die to one another at a chosen separation. The choosing and depositing steps are carried out so that the adhesive/spacer material occupies at most about 50% of the die bonding region following the securing step.

An eighth aspect of the invention is directed to a method for creating a multiple-die semiconductor chip package. A first die, comprising a first surface with bond pads at the first surface, is mounted to a substrate. The bond pads and the substrate are connected with wires. An adhesive/spacer material having spacer elements within an adhesive is selected. The adhesive/spacer material is deposited onto a first surface of the first die at a plurality of spaced-apart positions. A second surface of a second die is located opposite at the first surface of the first die and in contact with the adhesive/spacer material therebetween thereby: defining a die bonding region between the first and second surfaces, and securing the first and second die to one another at a chosen separation to create a multiple-die subassembly. The selecting and depositing steps are carried out so that the adhesive/spacer material occupies at most about 50% of the die bonding region. The multiple-die subassembly is encapsulated to create a multiple-die semiconductor chip package, with the encapsulating material occupying a second percentage of the die bonding region.

The present invention provides several potential advantages over conventional die stacking structure, specifically silicon spacer die and conventional spacer adhesives. The number of processing steps is reduced compared to conventional packages using silicon spacer wafers. According to the present invention, material processing can be simplified, the amount of spacer material used can be reduced and package reliability and productivity can be potentially increased.

Various features and advantages of the invention will appear from the following description in which the preferred embodiments have been set forth in detail in conjunction with the accompanying drawings.

DETAILED DESCRIPTION

Figure 1:
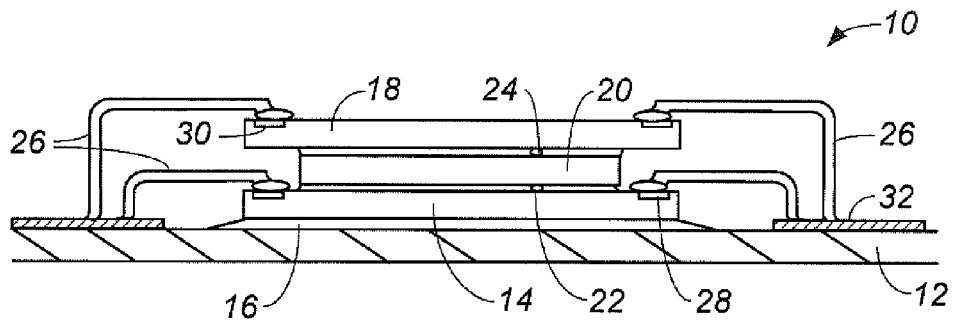
FIGS. 1 and 2 are side views of conventional multiple die subassemblies using a spacer die and an adhesive/spacer material to separate the upper and lower die, respectively.

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Several prior art structures and embodiments made according to the invention are discussed below. Like reference numerals refer to like elements.

Figure 2:
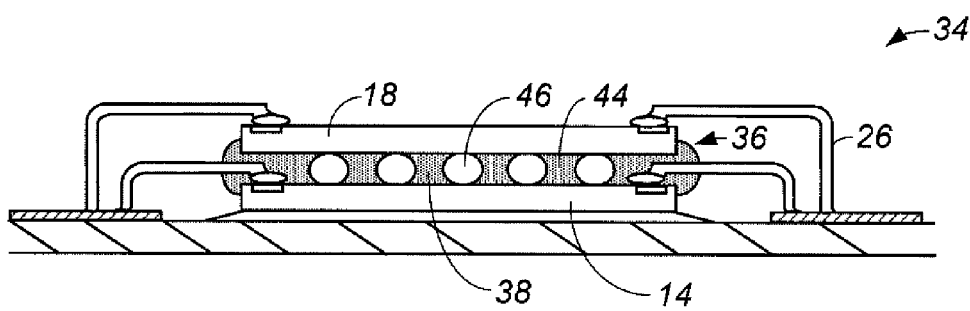
Figure 3:
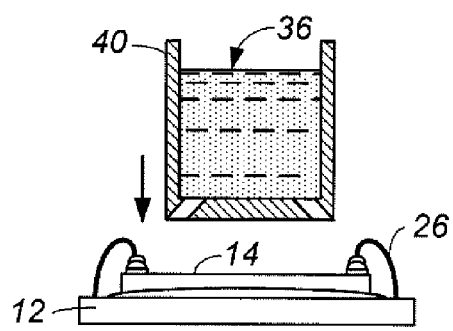
FIGS. 3-5 illustrate deposition of adhesive/spacer material onto a lower die using a shower head-type of dispenser.
Figure 4:
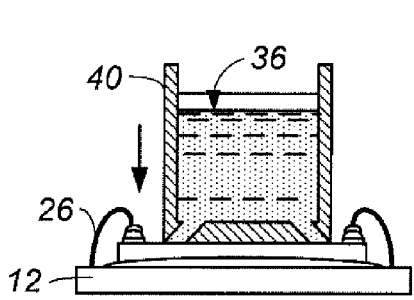

FIG. 1 illustrates a conventional multiple die subassembly 10 comprising a substrate 12 to which a first, lower die 14 is adhered using an adhesive 16. A second, upper die 18 is mounted to first die 14 by a spacer die 20, the spacer die being adhered to first and second die 14, 18 by adhesive layers 22, 24. Wires 26 connect bond pads 28, 30 of first and second die 14, 18 with bond pads 32 on substrate 12. FIG. 2 shows a conventional multiple die subassembly 34 similar to that of FIG. 1 but using a spacer/adhesive material 36 instead of spacer die 20 and adhesive layers 22, 24. Spacer/adhesive material 36 completely fills the die-bonding region 38 defined between first and second die 14, 18.

FIGS. 3-6 illustrate one procedure according to the invention for applying adhesive/spacer material 36 to a first die 14. In this embodiment a shower head-type dispenser 40 is used to apply material 36 at four spaced apart positions on first die 14. It is typically preferred to use a dot pattern type of shower head-type dispenser 40 instead of a conventional dispenser capillary because the one-step injection process can reduce dispensing time. Also, the amount and position for each deposit 42 can also be more easily controlled.

Figure 5:
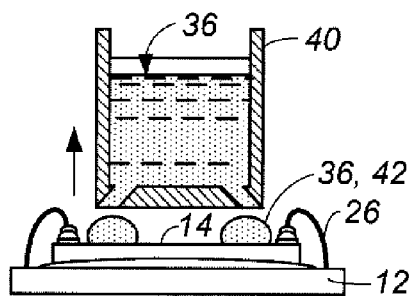
Figure 6:
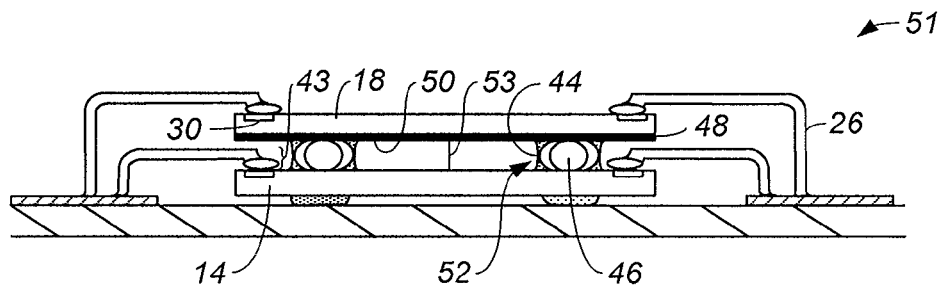
FIG. 6 is a side view of a multiple-die subassembly made according to the invention following the deposition step of FIG. 5 and placement of an upper die onto the deposits of adhesive/spacer material creating adhesive/spacer islands supporting the upper die on and securing the upper die to the lower die.
Figure 7:
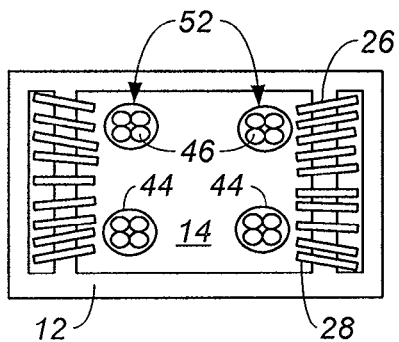
FIG. 7 is a top view of the subassembly of FIG. 6 with the top die removed to illustrate the adhesive/spacer islands.

Each deposit 42 of material 36, see FIGS. 5-7, comprises adhesive 44 and at least one spacer element 46. Material 36 may be a conventional material such as Loctite® QMI536-3, 4, 6, which uses nominal 3, 4 and 6 mil (75, 100 and 150 micrometers) diameter organic polymer spherical particles as spacer elements 46, or a spacer adhesive from the Ablestik 2025 Sx series. It is preferred that spacer elements 46 be an organic polymer material and pliable and large enough to accommodate wires 26 extending from bond pads 28 on, in this embodiment, first die 14. Spacer elements 46 are typically about 30-250 micrometers in diameter. Material 36 also helps to provide bond line thickness control and die tilt control. Examples of suitable materials for spacer elements 46 include PTFE and other polymers.

Spacer elements 46, prior to use, are typically spherical, ellipsoidal, cylindrical with hemispherical or ellipsoidal ends, or the like. After assembly, assuming spacer elements 46 are compressible, spacer elements 46 are compressed to some degree and have flattened areas where they contact lower and upper die 14, 18; the shape of such spacers is collectively referred to as generally ellipsoidal. For example, an initially spherical spacer element 46 having an 8 mil (200 micrometer) diameter will typically compress to a height of about 7.5 mil (188 micrometers). The height of spacers 46, which is equal to chosen separation 53, is usually at least equal to a wire loop height 43, is more usually greater than the wire loop height 43, and can be at least about 10% greater than the wire loop height 43. The wire loop height 43 of the wires 26 is defined as a height of the wires 26 extending from the bond pads 28 of first, lower die 14. If desired, the selection of the spacer elements includes selecting spacer elements so that chosen separation 53 is equal to the wire loop height 43 plus an allowance for manufacturing tolerance build-up resulting from making the wire bonds, the variance in the size and compressibility the of spacer elements 46 and other appropriate variables.

Figure 8:
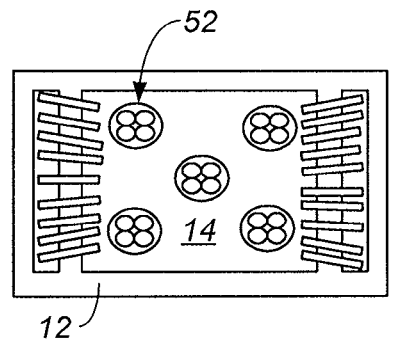
FIG. 8 illustrates an alternative embodiment of the structure shown in FIG. 7.

FIG. 8 illustrates an alternative embodiment in which dispenser 40 previously dispensed five spaced apart deposits 42 of material 36 onto first die 14. The number, size and position of deposits 42 will depend upon various factors including the size of the die and the package description.

Following the deposition of deposits 42, second, upper die 18, preferably having a dielectric layer 48 at its second, lower surface 50, is secured to first, lower die 14 by deposits 42 of material 36 to create a multiple-die subassembly 51 with upper and lower die 14, 18 separated by a chosen separation 53. See FIG. 6. This causes deposits 42 to spread out somewhat, see FIGS. 7 and 8, creating adhesive/spacer islands 52 spaced apart from one another. In the embodiment of FIGS. 3-8, each deposit 42 of material 36 creates a separate adhesive/spacer island 52; that is, none of the deposits 42 merge. In some situations certain of the deposits 42 of material 36 may merge while still creating a plurality of adhesive/spacer islands 52. See, for example, the adhesive/spacer islands 52A of FIGS. 9 and 10.

The dielectric layer 48 serves to prevent electrical shorting in the event of contact between the die 18 and the wire loops between it and the die 14 upon which it is mounted. This provides a significant advantage in manufacturing, according to the invention. Where no dielectric layer is provided on the underside of the upper die in a stack, the finished separation between the lower surface of the upper die and the upper surface of the lower die must necessarily be at least as great as the design wire loop height above the upper surface of the lower die. Because of variations in manufacture the specified separation must be made considerably greater than the design wire loop height; particularly, for example, some allowance must be made for variation in the actual heights of the loops, variation in the size of the spacer elements (particularly, variation in the height dimension of the compressed spacer elements). These allowances can result in significant addition to the separation in the finished stack and, therefore, these allowances can result significant increase in the overall thickness of the finished package. The effect is greater where a multiple die package includes more than two separated (spaced apart) stacked die.

In contrast, where the underside of the upper die in a stacked pair of die according to the invention is provided with a dielectric layer, the allowance may be considerably reduced. Although it may not be particularly desirable for the wire loops to contact the underside of the upper die (that is, to contact dielectric layer), it is not fatal to the package if contact sometimes results during manufacture and, accordingly, it is not necessary to add significantly to the separation specification or to the resulting package height.

Figure 9:
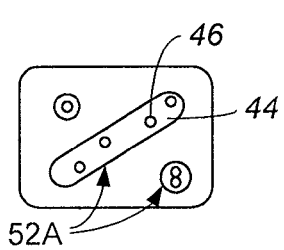
FIGS. 9-11 illustrate alternative embodiments of the lower die of FIG. 7 with adhesive/spacer islands having different sizes and shapes.
Figure 10:
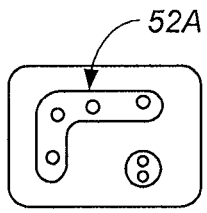
Figure 11:
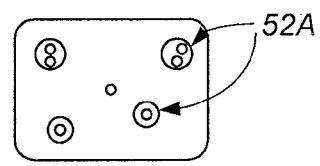
Figure 12:
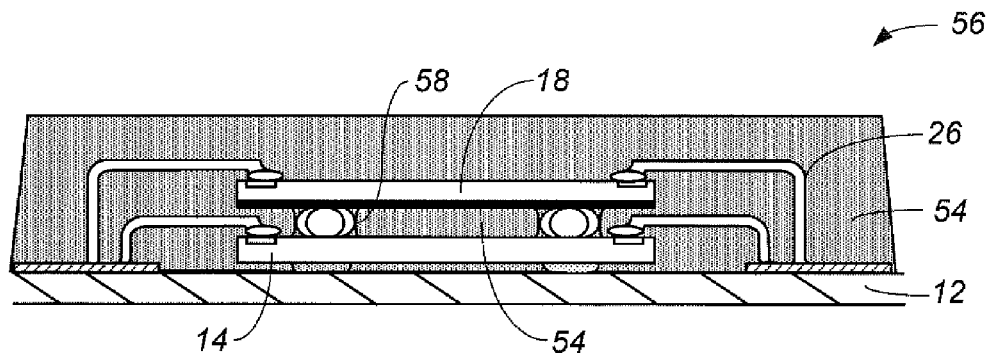
FIG. 12 illustrates a multiple-die semiconductor chip package made according to the invention by encapsulating the multiple-die subassembly of FIG. 6 with an encapsulating material.

The multiple spacer island embodiments of FIGS. 6-11 may be designed so that each of the adhesive/spacer islands 52 is the same size, such as in FIGS. 6 and 7, or of different sizes, such as adhesive/spacer islands 52A in FIGS. 9-11. Adhesive/spacer islands 52, 52A occupy only a percentage of die bonding region 38, preferably at most about 50% and more preferably about 20-50 percent of die bonding region 38. Thereafter, an encapsulating material 54 is used to create a multiple-die semiconductor chip package 56 as shown in FIG. 12. The encapsulating process typically occurs under a vacuum so that encapsulating material 54 also effectively fills the open regions between islands 52, 52A so that encapsulating material 54, wires 26 and islands 52 occupied about 100% of die bonding region 38 therefore effectively eliminating voids within the die bonding region.

Encapsulating material 54 may be a conventional material comprising a filled epoxy; filled epoxy materials typically comprise about 80-90 percent small, hard filler material, typically 5-10 micrometer glass or ceramic particles. Therefore, conventional encapsulating material 54 would not be suitable for use as adhesive 58 because the small, hard filler material could be captured between spacer element 46 and either or both of die 14, 18, resulting in damage to the die. Boundaries 58 are created between adhesive/spacer islands 52 and encapsulating material 54.

Figure 13:
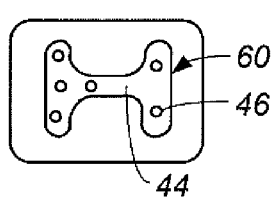
FIGS. 13-15 illustrate continuous expanses of adhesive/spacer material instead of spaced-apart adhesive/spacer islands.
Figure 14:
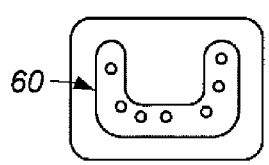
Figure 15:
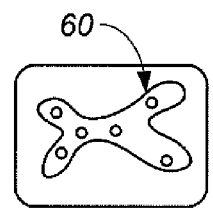

In some situations the plurality of spaced-apart adhesive/spacer islands 52, 52A may be replaced by a continuous expanses 60 of adhesive/spacer material 36 such as illustrated in FIGS. 13-15. Continuous expanse 60 of material 36 may be deposited so that it preferably occupies at most about 50% of die bonding region 38, and more preferably about 20-50% of die bonding region 38. The continuous expanse 60 can be a non-convex continuous expanse 60, where the non-convex continuous expanse 60 does not contain all points in a line segment joining at least a pair of constituent points in the non-convex continuous expanse 60.

Figure 16:
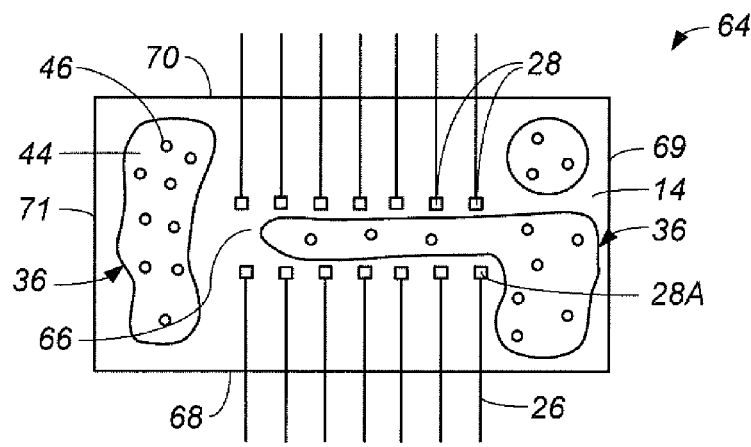
FIG. 16 is a simplified plan view of a center bonded die with adhesive/spacer material applied thereto.

The present invention finds particular utility for use with a center bonded die 64, see FIG. 16, such as a DRAM, having peripheral edges 68-71 and having bond pads 28 at a central region 66 of die 64. Wires 26 extending from bond pads 28 extend past peripheral edges 68, 70. The distance between the bond pads and the corresponding peripheral edges for a center bonded die is preferably much more than 100 micrometers. More preferably, the distance between a bond pad 28 for a center bonded die 64 and the nearest peripheral edge is at least about 40% of the corresponding length or width of the die. For example, the distance between a bond pad 28A and peripheral edge 68 is at least about 40% of the length of peripheral edge 69. Assuming peripheral edge 69 is 8 mm long, the distance between bond pad 68A and peripheral edge 68 is at least about 3.2 mm.

Figure 17:
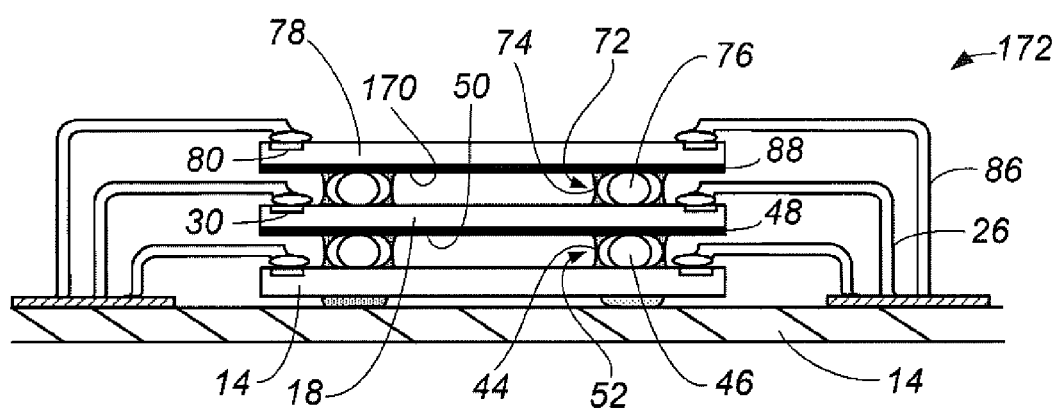
FIG. 17 is a side view of a multiple-die subassembly made according to the invention having a third die mounted upon the second die in a subassembly as in FIG. 6, following deposition of adhesive/spacer material as illustrated in FIG. 5 onto the second die, and placement of the third die onto the deposits of adhesive/spacer material creating adhesive/spacer islands supporting the third die on and securing the third die to the second die.

The multiple die packages illustrated by way of example in FIG. 12 have two die in the stack, a first die and a second die. Multiple die packages according to the invention may have three or more die in the stack. A multiple die stack having three stacked die, for example, can be made by providing a multiple-die assembly as in FIG. 6, and mounting an additional die upon the second die by depositing adhesive/spacer material onto the second die generally as shown in FIG. 5 and placing the third die onto the deposits to make a three-die assembly as shown generally at 172 in FIG. 17. Referring to FIG. 17, a two die assembly as in FIG. 6 has a die 18 stacked over a die 14, which is mounted onto a substrate 12 using an adhesive (in this instance, adhesive spots are used to attach the die 14 to the substrate 12). The die 18 is separated from the die 14 by adhesive/spacer islands 52, each including adhesive 44 and at least one spacer element 46. A dielectric layer 48 applied onto the lower surface 50 of the die 18 serves to prevent electrical shorting between the die 18 and wire bonds interconnecting the die 14 and the substrate 12, and thereby allows for reduction of tolerances for the spacer dimension, as described above. Interconnection of the die 18 with the substrate 12 is made by wire bonds 26 connected to bond pads 30 on die 18. To mount an additional die 78, deposits of adhesive/spacer material, including adhesive 74 and at least one spacer element 76, are applied on the surface of die 18, generally as described above with reference to FIGS. 3-5, and then die 78, having a dielectric layer 88 applied onto the lower surface 170, is placed upon the adhesive/spacer material deposits. The resulting adhesive/spacer islands 72 provide a sufficient between the die 78 and the die 18 equal to a design wire loop height for wire bonds 26 plus an allowance for manufacturing tolerance. Electrical interconnect between the die 78 and the substrate is then made, using a wire bonding tool to connect to bond pads 80. According to the invention, further additional die can be added to the stack. When the stack is complete, an encapsulating process is employed to complete the package and, where the package is made in an array of packages on a multipackage substrate, the packages are separated from one another by saw- or punch-singulation.

The adhesive/spacer structures are shown in FIGS. 6 and 17 as constituting islands having regular size and shape; according to the invention the islands may have any of various shapes and sizes, as described above with reference, for example, to FIGS. 9-11 and 13-16.

In multiple die packages according to the invention, at least two die in the stack are separated by an adhesive/spacer structure; or, at least the lower die in the stack is separated from the substrate by a adhesive/spacer structure. All the die may be separated by spacers, at least two of them being separated by a adhesive/spacer structure; or, in some instances where one or more die is narrower than the die upon which it is stacked, no spacer may be required between those two die.

Other modification and variation can be made to the disclosed embodiments without departing from the subject of the invention as defined in the following claims. For example, although the above embodiments disclose the use of adhesive/spacer material 36 between lower and upper die 14,18, material 36 may also be used with multiple die semiconductor chip packages having, for example, four die with material 36 used between one, two or three of the pairs of adjacent die. Also, although the above described embodiments show the bump reverse bonding method for attaching wires 26 to bond pads 28, 30, the conventional forward wire bonding method can also be used.

Any and all patents, patent applications and printed publications referred to above are incorporated by reference.

Other embodiments are within the scope of the invention.

What is claimed is:

1. A method for adhering first and second die to one another at a chosen separation in a multiple-die semiconductor chip package, the method comprising:

connecting a wire between a bond pad of a first die and a substrate with the wire having a wire loop height extending from the bond pad;
selecting an adhesive/spacer material having pliable spacer elements within an adhesive;
depositing the adhesive/spacer material onto a first surface of the first die, the adhesive/spacer material covering 20-50 percent of the first surface of the first die;
providing an electrically non-conductive second surface of a second die with a dielectric layer;
locating the second surface of the second die opposite the first surface of the first die and in contact with the adhesive/spacer material therebetween thereby:
securing the first and second die to one another at the chosen separation; and
encapsulating the first die, the second die, and the adhesive/spacer material with an encapsulating material of a filled epoxy containing 80-90 percent filler material.

2. The method according to claim 1 wherein the selecting step includes choosing spacer elements having the same size and shape.

3. The method according to claim 1 wherein the depositing step is carried out to create a plurality of generally equal-size islands of the adhesive/spacer material after the securing step.

4. The method according to claim 1 wherein the depositing step is carried out to create at least three generally equal-size islands of the adhesive/spacer material after the securing step.

5. A method for creating a multiple-die semiconductor chip package, the method comprising:
mounting a first die to a substrate, the first die having a first surface with bond pads at the first surface;
connecting the bond pads and the substrate with wires, having heights within a wire loop height extending from the bond pads;
selecting an adhesive/spacer material comprising pliable spacer elements within an adhesive;
depositing the adhesive/spacer material onto a first surface of the first die;
providing an electrically non-conductive second surface of a second surface of a second die with a dielectric layer;
locating a second surface of the second die opposite the first surface of the first die and in contact with the adhesive/spacer material therebetween thereby:
defining a die bonding region between the first and second surfaces; and
securing the first and second die to one another at a chosen separation to create a multiple-die subassembly with the adhesive/spacer material occupying a first percentage of 20-50 percent of the die bonding region; and
encapsulating the multiple-die subassembly to create a multiple-die semiconductor chip package, the encapsulating material occupying a second percentage of the die bonding region, the encapsulating material of a filled epoxy containing 80-90 percent filler material, and the wires within the die bonding region occupying a third percentage of the die bonding region.

6. The method according to claim 5 wherein depositing the adhesive/spacer material includes depositing multiple adhesive/spacer islands of different sizes.

7. The method according to claim 5 wherein the depositing step includes depositing continuous expanses of adhesive/spacer material so that the first percentage is at most about 50 percent.

8. The method according to claim 5 wherein, the sum of the first, second and third percentages is about 100% thereby effectively eliminating voids within the die bonding region.

9. A method for adhering opposed surfaces of first and second die to one another at a chosen separation in a multiple-die semiconductor chip package, the method comprising:
   connecting a wire between a bond pad of a first die and a substrate with the wire having a wire loop height extending from the bond pad;
   selecting an adhesive/spacer material having pliable spacer elements within an adhesive;
   choosing an amount of the adhesive/spacer material;
   depositing the chosen amount of the adhesive/spacer material onto a first surface of the first die, the adhesive/spacer material covering 20-50 percent of the first surface of the first die;
   providing an electrically non-conductive second surface of a second die with a dielectric layer;
   locating the second surface of the second die opposite at the first surface of the first die and in contact with the adhesive/spacer material therebetween thereby:
      defining a die bonding region between the first and second surfaces;
   securing the first and second die to one another at the chosen separation; and
   encapsulating the first die, the second die, and the adhesive/spacer material with an encapsulating material of a filled epoxy containing 80-90 percent filler material.

10. The method according to claim 9 wherein depositing the adhesive/spacer material includes depositing multiple adhesive/spacer islands of different sizes.

11. The method according to claim 9 wherein the choosing step is carried out so that the adhesive/spacer material occupies about 20-50% of the die bonding region.

12. A method for creating a multiple-die semiconductor chip package, the method comprising:
   mounting a first die to a substrate, the first die comprising a first surface with bond pads at the first surface;
   connecting the bond pads and the substrate with wires, having heights within a wire loop height extending from the bond pads;
   selecting an adhesive/spacer material having pliable spacer elements within an adhesive;
   depositing the adhesive/spacer material onto a first surface of the first die to for a non-convex continuous expanse;
   locating an electrically non-conductive second surface of a second die having a dielectric layer thereon opposite at the first surface of the first die and in contact with the adhesive/spacer material therebetween thereby:
      defining a die bonding region between the first and second surfaces; and
      securing the first and second die to one another at a chosen separation to create a multiple-die subassembly with a first percentage of 20-50 percent of the die bonding region occupied by the adhesive/spacer material; and
   encapsulating the multiple-die subassembly to create a multiple-die semiconductor chip package, the encapsulating material occupying a second percentage of the die bonding region, the encapsulating material of a filled epoxy containing 80-90 percent filler material, and the wires within the die bonding region occupying a third percentage of the die bonding region.

13. The method according to claim 12 wherein depositing the adhesive/spacer material includes depositing multiple adhesive/spacer islands of different sizes.

14. The method according to claim 12 wherein, the sum of the first, second and third percentages is about 100% thereby effectively eliminating voids within the die bonding region.

* * * * *

UNITED STATES PATENT AND TRADEMARK OFFICE
CERTIFICATE OF CORRECTION

| | | |
|---|---|---|
| PATENT NO. | : 8,623,704 B2 | Page 1 of 1 |
| APPLICATION NO. | : 11/530841 | |
| DATED | : January 7, 2014 | |
| INVENTOR(S) | : Lee et al. | |

It is certified that error appears in the above-identified patent and that said Letters Patent is hereby corrected as shown below:

In the Claims:

1. Column 8, claim 5, line 39 through line 41, delete the following:

"providing an electronically non-conductive second surface of a second surface of a
            second die with a dielectric layer;
        locating a second surface of the second die opposite the"

and insert therefor:

--providing a second surface of a second die with a dielectric layer;
        locating an electrically non-conductive second surface of the second die opposite
        the--

2. Column 10, claim 12, line 9, after "first die", delete "to for a non-convex continuous expanse"

Signed and Sealed this
Seventh Day of June, 2016

Michelle K. Lee
*Director of the United States Patent and Trademark Office*